US012575066B2

(12) United States Patent
Fuller et al.

(10) Patent No.: US 12,575,066 B2
(45) Date of Patent: Mar. 10, 2026

(54) SYSTEM FOR COOLING COMPUTING DEVICES IN AN ARRAY

(71) Applicant: Core Scientific Operating Company, Austin, TX (US)

(72) Inventors: Thomas Middleton Rutledge Fuller, Seattle, WA (US); Harsh Patel, Stone Mountain, GA (US)

(73) Assignee: Core Scientific, Inc., Miami, FL (US)

( * ) Notice: Subject to any disclaimer, the term of this patent is extended or adjusted under 35 U.S.C. 154(b) by 241 days.

(21) Appl. No.: 18/286,991

(22) PCT Filed: Mar. 9, 2022

(86) PCT No.: PCT/US2022/019519
§ 371 (c)(1),
(2) Date: Oct. 13, 2023

(87) PCT Pub. No.: WO2022/192376
PCT Pub. Date: Sep. 15, 2022

(65) Prior Publication Data
US 2024/0196570 A1 Jun. 13, 2024

Related U.S. Application Data

(60) Provisional application No. 63/159,701, filed on Mar. 11, 2021.

(51) Int. Cl.
*H05K 7/20* (2006.01)
*G06F 1/20* (2006.01)

(52) U.S. Cl.
CPC ........... *H05K 7/20727* (2013.01); *G06F 1/20* (2013.01); *H05K 7/20172* (2013.01); *H05K 7/20209* (2013.01)

(58) Field of Classification Search
CPC .......... H05K 7/20145; H05K 7/20172; H05K 7/20727; H05K 7/20736; H05K 7/20154; H05K 7/20209; H05K 7/20745; H05K 7/20163; H05K 7/2039; H05K 7/20781; H05K 7/20818; H05K 7/20836; H05K 1/0203; H05K 7/20136; H05K 7/20263; H05K 7/20509; H05K 7/20709;
(Continued)

(56) References Cited

U.S. PATENT DOCUMENTS 6,293,753 B1 9/2001 Pal
2010/0002382 A1 1/2010 Aybay
(Continued)

FOREIGN PATENT DOCUMENTS

CN 209767991 U 12/2019

OTHER PUBLICATIONS

English abstract for CN-209767991.

*Primary Examiner* — Michael A Matey
(74) *Attorney, Agent, or Firm* — Fishman Stewart PLLC

(57) ABSTRACT

A system for cooling a two-dimensional array of computing devices is disclosed. A fan is configured to move air through the array of computing devices, which may be fan-less. The fan's width and height may correspond to the two-dimensional array's width and height. The two-dimensional array may be radially configured, and a shroud may be connected between the fan and the array of computing devices. The shroud may have profiles matching the fan and the array of computing devices.

19 Claims, 12 Drawing Sheets

(58) Field of Classification Search
CPC ........... H05K 7/20718; H05K 7/20754; H05K
7/2079; G06F 1/20; G06F 1/181; G06F
1/206; F25D 17/00; F28D 1/024; G02F
2201/36; G11B 33/142
See application file for complete search history.

(56) References Cited

U.S. PATENT DOCUMENTS

| | | | |
|---|---|---|---|
| 2010/0033931 A1 | 2/2010 | Miyazawa | |
| 2012/0133256 A1 | 5/2012 | Keisling | |
| 2013/0083481 A1* | 4/2013 | Goto ................. | H05K 7/20836 |
| | | | 361/695 |
| 2014/0362523 A1* | 12/2014 | Degner ............... | G02B 6/0008 |
| | | | 361/679.47 |
| 2017/0273220 A1* | 9/2017 | Nagasaka .......... | H05K 7/20727 |
| 2018/0295751 A1 | 10/2018 | Jochim | |
| 2020/0033837 A1 | 1/2020 | Simmons | |
| 2020/0154610 A1 | 5/2020 | Wilks | |
| 2020/0163256 A1 | 5/2020 | Chehade | |
| 2021/0270283 A1* | 9/2021 | Macqueen ............... | F04F 5/46 |
| 2022/0312643 A1* | 9/2022 | Gao ........................ | H01L 23/40 |

\* cited by examiner

SYSTEM FOR COOLING COMPUTING DEVICES IN AN ARRAY

CROSS-REFERENCE TO RELATED APPLICATION

This application claims the benefit of and priority to U.S. Provisional Patent Application Ser. No. 63/159,701, filed on Mar. 11, 2021, the disclosure of which is hereby incorporated by reference in its entirety as though fully set forth herein.

TECHNICAL FIELD

The present disclosure generally relates to cooling computing devices such as in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing units (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute-intensive workloads (e.g., rendering, artificial intelligence, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional methods for improving cooling of computing devices in data centers include mixing in refrigerated air to reduce the temperature of the air that is forced across the computing device by its built-in cooling fans. A significant drawback to this approach is that refrigeration uses significant amounts of energy on top of the energy already used by the computing devices themselves.

For at least these reasons, there is a desire for a more energy efficient solution to allow for improved efficient cooling and thermal management of groups of computing devices such as in a data center.

SUMMARY

A system for improved cooling of a plurality of computing devices is contemplated. In one example embodiment, the system comprises one or more shelves configured to support the computing devices in a two-dimensional array, and a fan configured to move air (e.g., push or pull) through the array of computing devices. The fan's width and height may correspond to the two-dimensional array's width and height. The two-dimensional array may be circular, with a diameter approximately matching the fan's width. By using a large fan that spans many devices instead of many smaller fans limited by the size of the computing devices, the system may move more air and increase cooling efficiency.

In some embodiments, the system may include a shroud that is connected between the fan and the array of computing devices. The shroud may aid in preventing air flow from the fan escaping between the output of the fan and the array of computing devices and prevent the air pressure from dropping. The shroud may have profiles matching the fan and the array of computing devices. For example, the shroud may have a first end with a circular profile corresponding to the output of the fan and a second end having a profile corresponding to the outer edge of the two-dimensional array of computing devices.

The two-dimensional array of computing devices may be hollow with a central region free of computing devices (e.g., filled with a spacer, cabling or one or more components not needing as much cooling such as controller cards) to accommodate lower airflow corresponding to the fan's center hub.

In some embodiments, the two-dimensional array may be a radial two-dimensional array (e.g., either hollow or filled). In other embodiments the two-dimensional array may be a convex polygon array.

In some embodiments, an air barrier may be affixed to one side of the two-dimensional array of computing devices. The air barrier may have an opening corresponding to an outline of the two-dimensional array of computing devices. In some embodiments, the air barrier may also have a central portion corresponding to one or more central regions in the two-dimensional array that are free from computing devices.

In some embodiments, the system may include a shroud connected between the fan and the two-dimensional array of computing devices to prevent a drop in air pressure between the fan and the computing devices. In some embodiments the shroud may have a first end with a circular profile corresponding to the output of the fan and a second end with a profile corresponding to the extents of the two-dimensional array of computing devices.

A shroud for cooling a plurality of computing devices is also contemplated. In one embodiment, the shroud comprises a first planar circular opening configured to seal to a cooling fan, and a second planar convex polygon opening configured to seal to an outer edge of a two-dimensional array of fan-less computing devices.

In some embodiments, multiple sets of two-dimensional arrays of computing devices may be housed on one or more racks, with each array having its own large fan with a diameter that corresponds to the dimensions of the particular array to which it is attached (e.g., each fan's diameter corresponds to the width and height of the two-dimensional array that it cools).

The foregoing and other aspects, features, details, utilities, and/or advantages of embodiments of the present disclosure will be apparent from reading the following description, and from reviewing the accompanying drawings.

DETAILED DESCRIPTION

Figure 1:
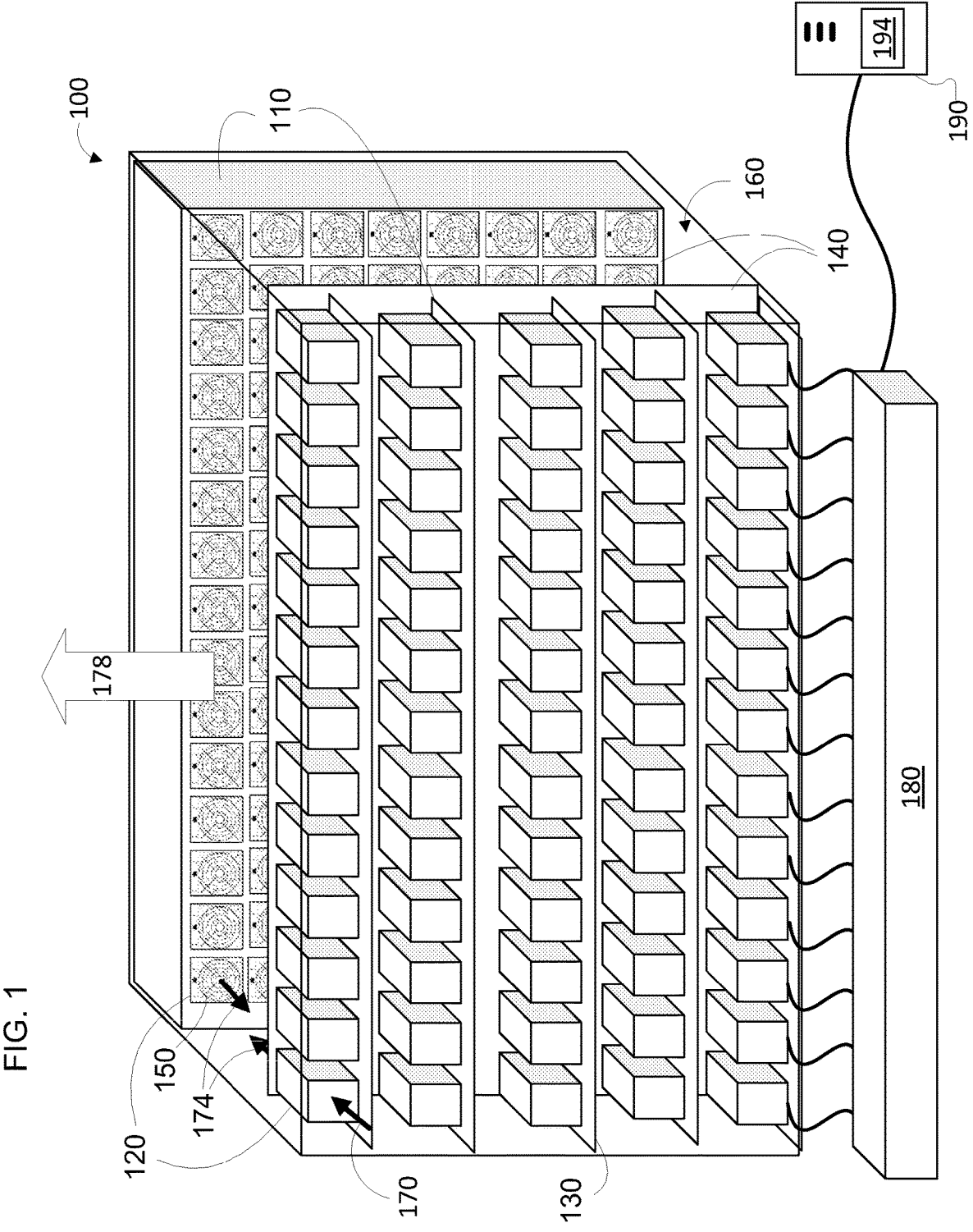
FIG. 1 is a diagram generally illustrating computing devices in a data center.

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. Turning now to FIG. 1, a diagram generally illustrating computing devices in a data center is shown. This example illustrates a pod 100 that has racks 110 that each have a number of shelves 130 for holding computing devices 120, thereby creating a two-dimensional array of computing devices on each rack or group of racks. In other embodiments, racks 110 may have rails that hold computing devices 120 in place on shelves 130. Each computing device 120 has one or more cooling fans 150 configured to draw air from outside the pod (often called a cool aisle) into the computing device for cooling, as shown by arrow 170. The moving air draws out heat from computing device 120 and is exhausted from the computing device as shown by arrows 174.

In some embodiments, computing device 120 may have two fans, one on the intake side and one on the exhaust side. In other embodiments multiple smaller fans may be used within computing device 120. Heated air is exhausted by computing devices 120 into the space between racks 110, called a hot aisle 160. The space between racks 110 is typically sealed except for one or more exhaust openings, typically in the ceiling, through which the heated air exits (as shown by arrow 178). In some embodiments, computing devices 120 are positioned adjacent to an air barrier 140 with openings large enough to allow the heated exhaust air from each computing device 120 to pass into hot aisle 160 but not escape out of hot aisle 160 other than through the exhaust vents.

Computing devices 120 may be networked together with a network switch 180 and may be managed by a management program 194 executing on a management computer 190. The management application or module is typically implemented in software (e.g., instructions stored on a non-volatile storage medium such as a hard disk, flash drive, or DVD-ROM).

In order to better cool computing devices 120, the management program 194 may be configured to dispatch instructions to computing devices 120 setting their operating parameters such as chip frequency, voltage, and fan speed.

Figure 2:
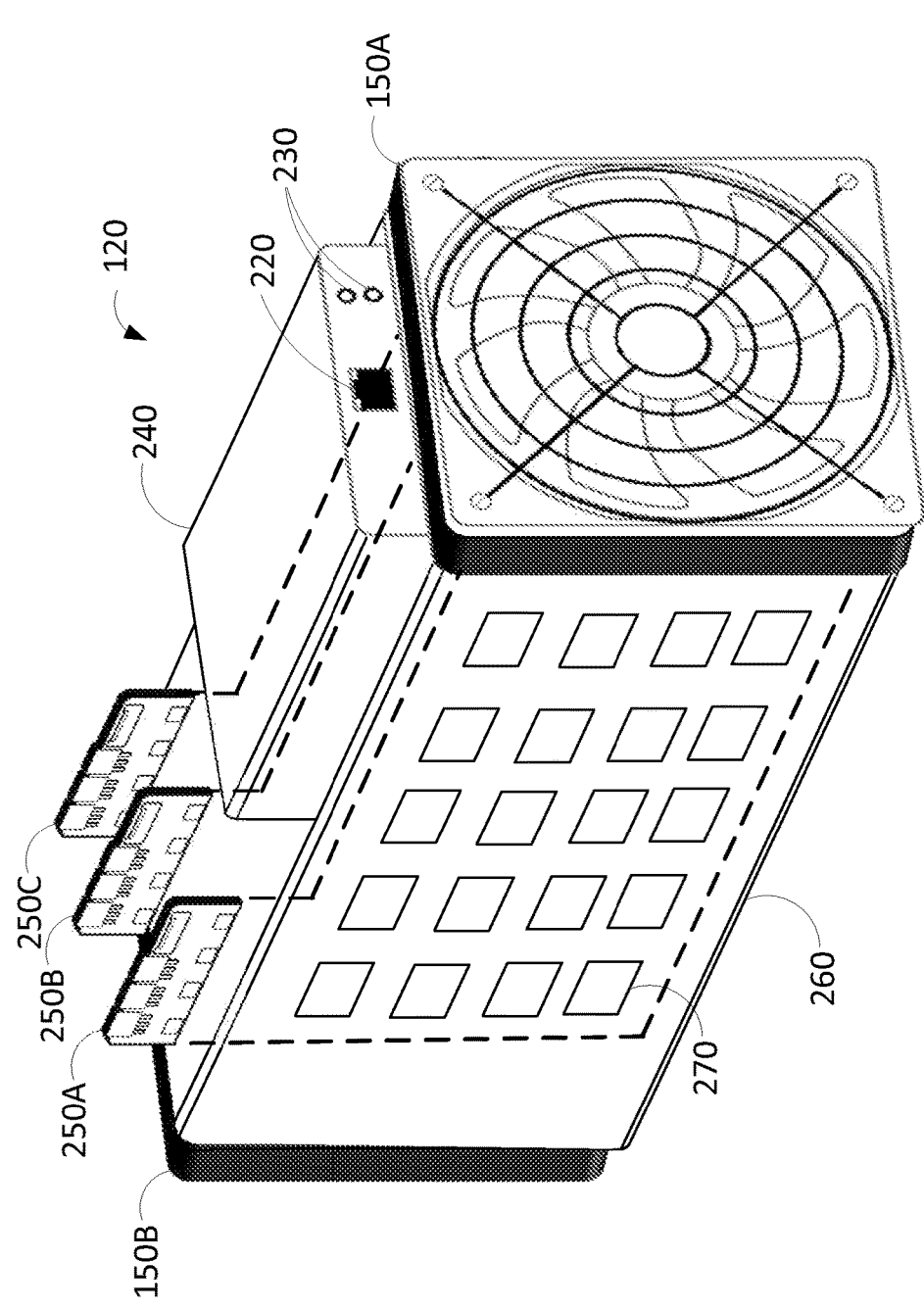
FIG. 2 is a diagram generally illustrating a perspective view of an example computing device.

Turning now to FIG. 2, a diagram generally illustrating a perspective view of an example computing device 120 is shown. In this example, computing device 120 is a cryptocurrency miner and includes a controller 240 that oversees operation of the multiple circuit boards 250A-C that perform the work or processing (e.g., calculating hashes or other mathematical operations). In this embodiment, the controller 240 includes a network port 220 for communications, and one or more status indicator LEDs 230. Two fans 150A-B (one front and one rear) draw cool air into one side of the computing device 120's case 260 and expel waste heat through the other side of the case 260. Other types of computing devices are possible and contemplated.

Circuit boards 250A-C each have multiple processors 270 (e.g., ASICs, GPUs, CPUs, FPGAs) that perform calculations, generating heat. For this reason, processors 270 often have heat sinks attached to them to cool the processors 270 by dissipating the waste heat into the air flowing through the computing device.

Figure 3:
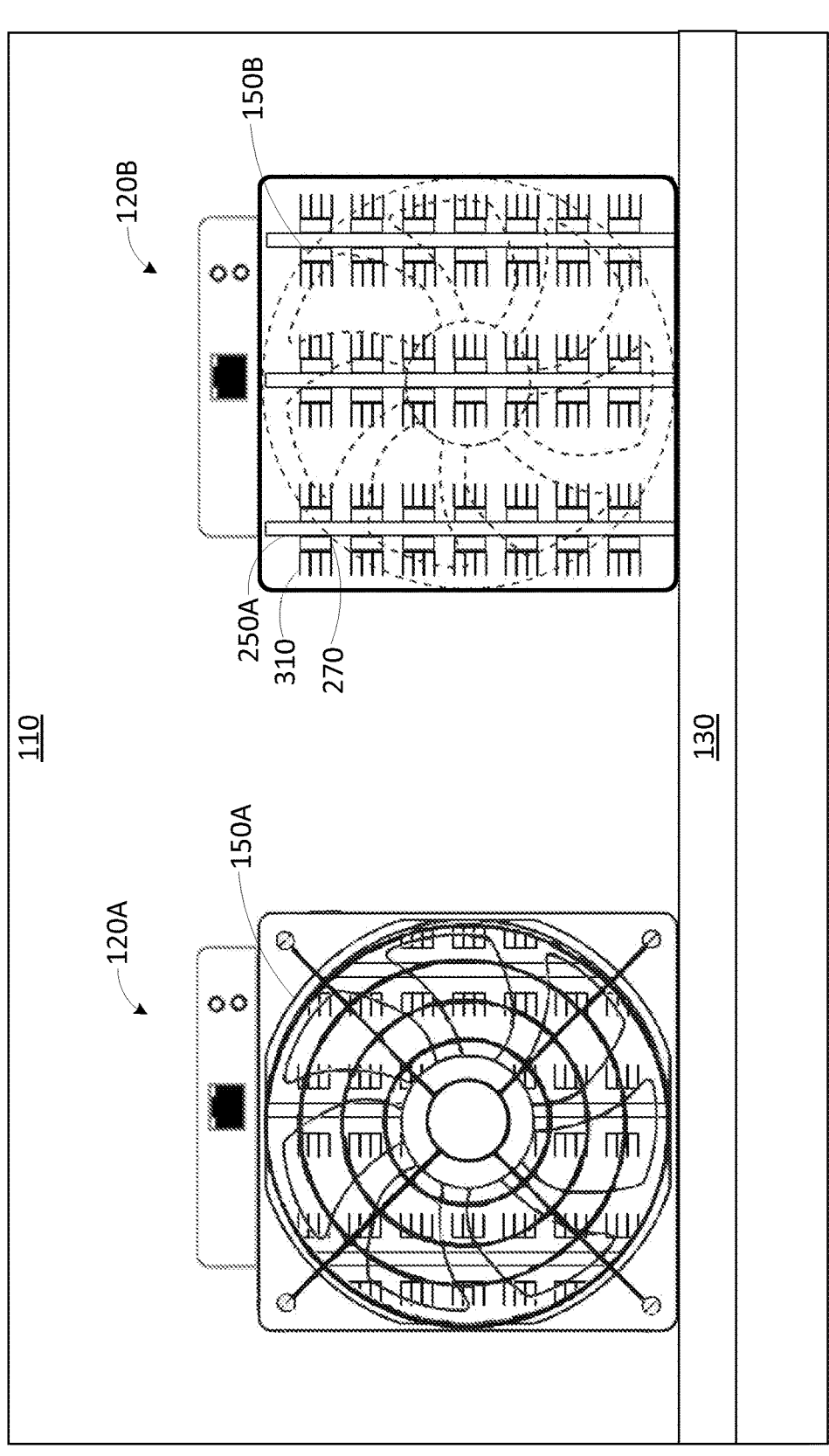
FIG. 3 is a diagram generally illustrating computing devices in a rack.

Turning now to FIG. 3, a diagram generally illustrating computing devices in a rack is shown. A frontal view of computing devices 120A and 120B positioned on one of shelves 130 is shown. In this view, front fans 150A and 150B are shown. Fan 150B is shown partially hidden to allow heat sink 310 connected to processor 270 on circuit board 250A to be seen.

One drawback to this approach is that each computing device may be reliant on one or more relatively small cooling fans. Due to their small size, they often have to spin at very high speeds (RPMs) to move enough air to properly cool the computing device. For data centers having large numbers of computing devices, this can mean thousands or tens of thousands of relatively small fans constantly operating at very high speeds. With such a large number of cooling fans, data center technicians may be frequently required to replace worn out fans. Computing device manufacturers often attempt to save money by reducing the cost of these fans. These fans may be suboptimal not only for cost reasons, but also due to size limitations that are a function of the computing device's case. Each time a computing device is replaced, a new set of fans are included with the new computing device. Over time, the original fans and all the replacement fans can lead to significant cost, energy usage, and e-waste (electronics waste).

Figure 4:
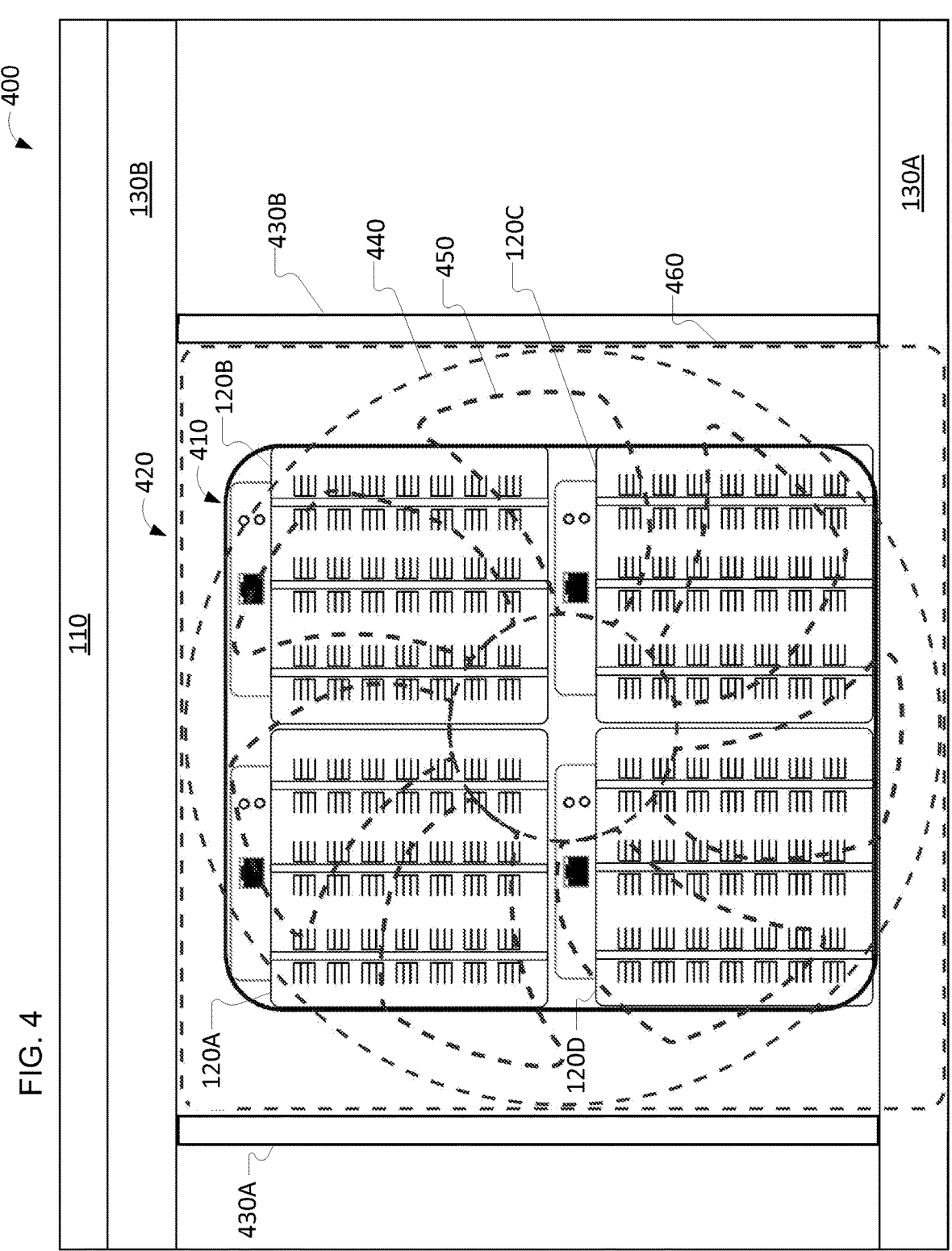
FIG. 4 is a diagram generally illustrating one example embodiment of a system for cooling computing devices according to the teachings of the present disclosure.

Turning now to FIG. 4, a diagram generally illustrating one example embodiment of an improved system for cooling computing devices according to the teachings of the present disclosure is shown. In this embodiment, a two-dimensional array of computing devices 410 is formed by a 2×2 grid of computing device 120A-120D. In this embodiment, computing devices 120A-D do not have individual cooling fans. Their cooling fans have either been removed, or preferably they may have been shipped from the manufacture without cooling fans installed (reducing cost and e-waste). Instead, a single larger fan such as cooling fan 420 is used to cool all of the computing devices. Cooling fan 420 comprises an impeller 450, a circular air guide 440, and a fan housing 460. Cooling fan 420 may have a diameter at least as large as the width or height of computing devices array 410 and may be operated in either a push or pull mode (i.e., either pushing air through or pulling air through the computing devices 120A-D). To prevent airflow from fan 420 leaking out the sides, side air barriers 430A-B may be used to guide or seal gaps around fan 420. For example, side air barriers 430A-B may be sealed to fan 420, shelves 120A-B, and to another air barrier behind the array of computing devices 410. This back air barrier is not shown in this figure, but it may for example be similar to air barrier 140 in FIG. 1. While a single array of computing devices 410 is shown in rack 110, multiple such arrays maybe included in each rack (e.g., vertically stacked, horizontally stacked).

Each cooling fan 420 may be network-controlled, with a management program 194 executing on a management computer 190 (as shown in FIG. 1) controlling the fan speeds and receive ambient temperature data and computing device temperatures to ensure proper cooling across the data center.

By using a larger fan 420 for multiple computing devices 120 instead of multiple smaller fans for each individual one of computing devices 120, airflow and cooling efficiency may be improved. A larger diameter fan may be able to push a larger volume of air through computing devices 120A-D. Larger fans may generate more airflow for a given RPM (rotations per minute) relative to smaller fans. Depending on the characteristics of the particular fans used, large fans operating at lower RPMs may be more efficient and also generate less turbulence and noise than many smaller fans operating at higher RPMs. By using fewer larger fans, the data center operator may also reduce maintenance costs associated with replacing many smaller fans.

Figure 5:
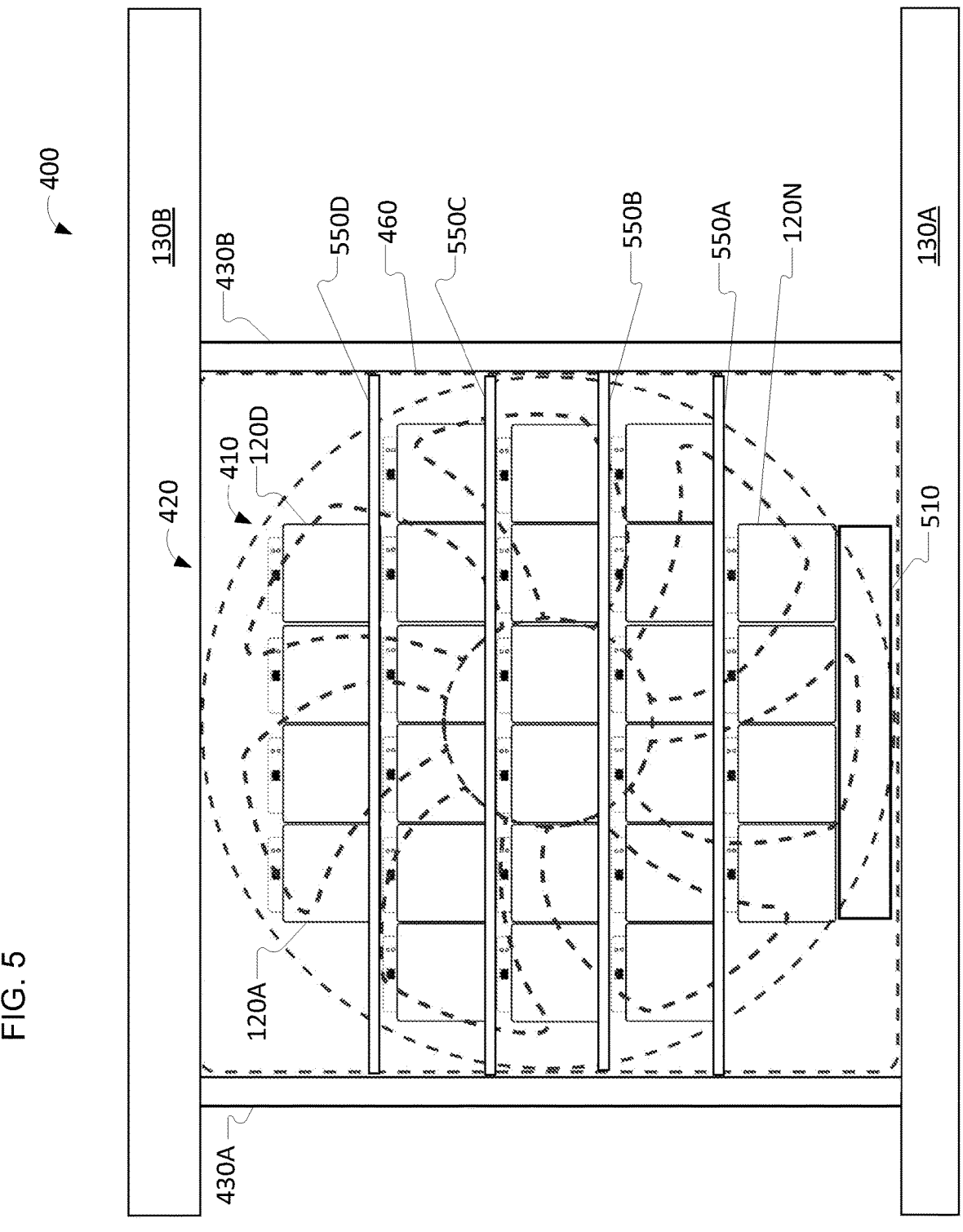
FIG. 5 is a diagram generally illustrating yet another example embodiment of a system for cooling computing devices according to the teachings of the present disclosure.

Turning now to FIG. 5, a diagram generally illustrating another example embodiment of a system 400 for cooling computing devices according to the teachings of the present disclosure is shown. In this embodiment, two-dimensional array of computing devices 410 comprises 26 computing devices 120A-N. The boundaries of two-dimensional array of computing devices 410 may be constructed to match the approximate impeller size of cooling fan 420. Array of computing devices 410 may be positioned on multiple shelves or horizontal supports 510 and 550A-D, or they may be stacked on each other directly without intermediate shelves or supports.

Figure 6:
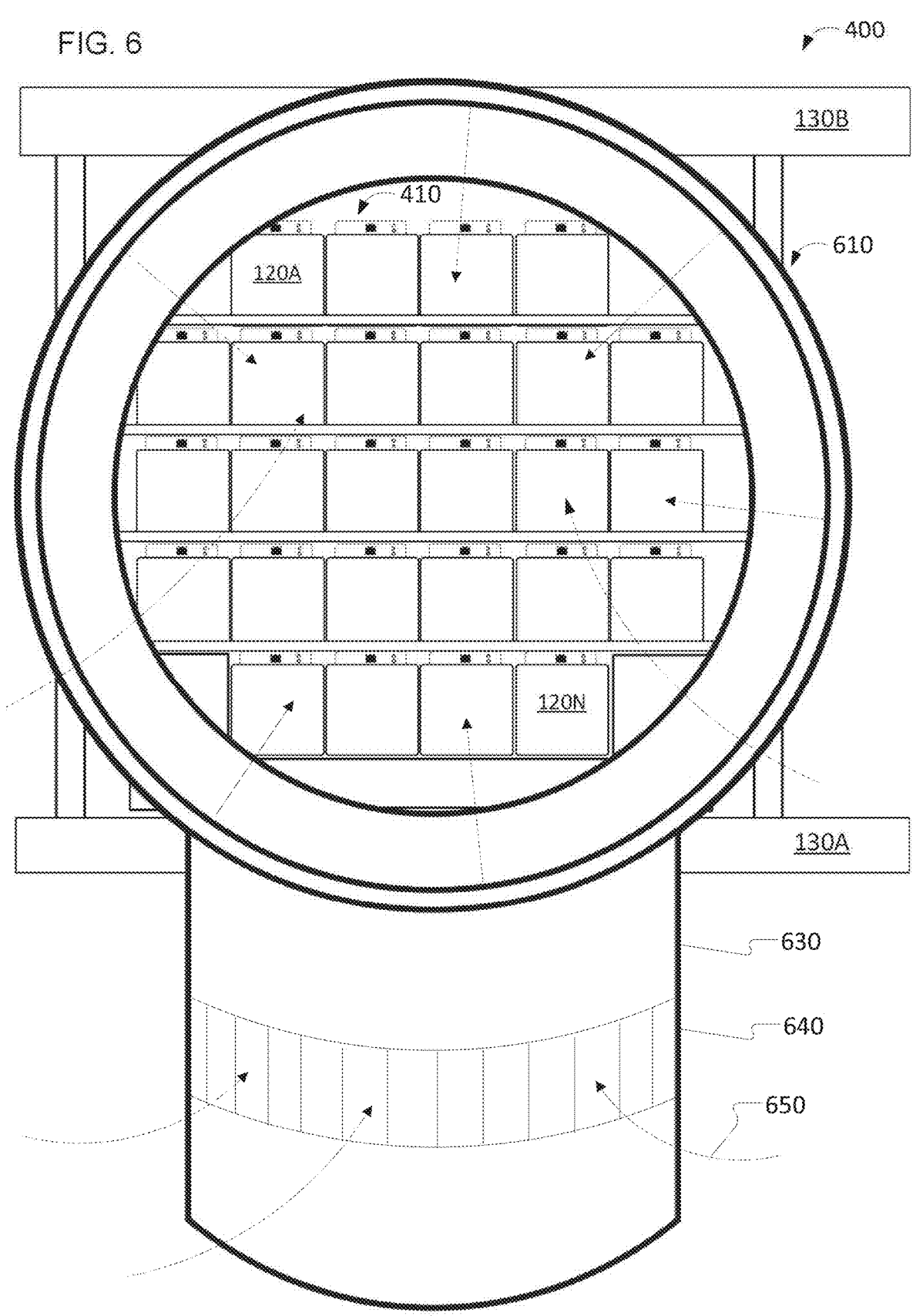
FIG. 6 is a diagram generally illustrating still another example embodiment of a system for cooling computing devices with a bladeless loop fan according to the teachings of the present disclosure.

Turning now to FIG. 6, a diagram generally illustrating still another example embodiment of a system 400 for cooling computing devices with a bladeless loop fan according to the teachings of the present disclosure is shown. In this embodiment, a bladeless loop fan assembly (e.g., as described in U.S. Pat. No. 8,308,445) is used to force air through a two-dimensional array of computing devices 410. The array of computing devices 410 may be configured so that its cross-section matches the airflow from the fan. In this type of fan, the impeller is positioned in the base 630 and draws air in through air intake 640 as shown by arrows 650. The air is forced through bladeless loop 610 and is multiplied by air passing through the bladeless loop. One advantage of a bladeless loop fan of this type is that access to individual computing devices 120A-N may be had without moving or even turning off the fan.

Figure 7:
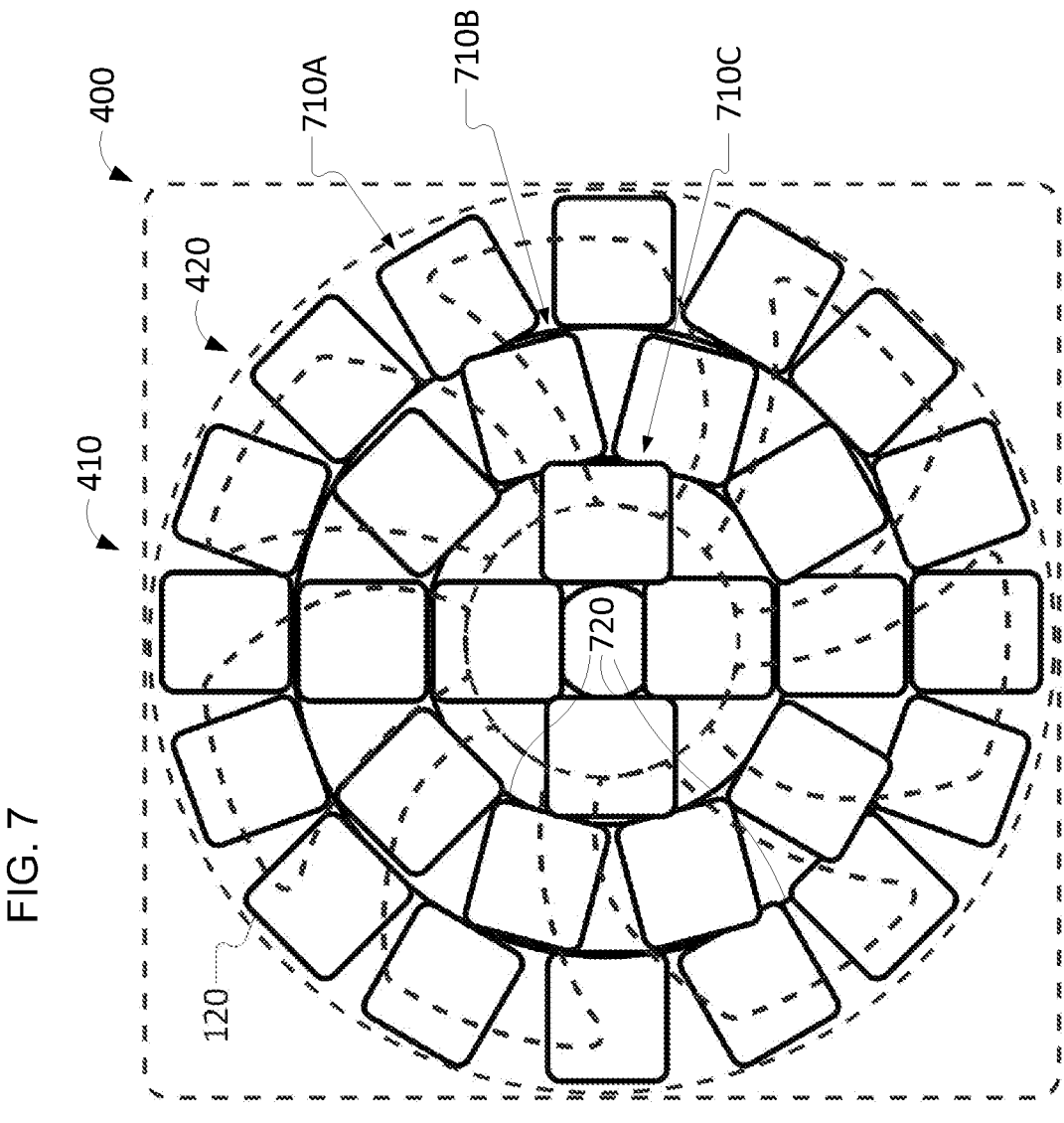
FIG. 7 is a diagram generally illustrating another example embodiment of a system for cooling computing devices according to the teachings of the present disclosure.

Turning now to FIG. 7, a diagram generally illustrating another example embodiment of a system 400 for cooling computing devices according to the teachings of the present disclosure is shown. In this embodiment, two-dimensional array of computing devices 410 may comprise a multi-tiered radial array of computing devices 120. As in the previous example, the width of the radial two-dimensional array of computing devices maybe selected to match the approximate diameter of fan 420. While different support structures may be used, in this embodiment each tier 710A-710C of computing devices 120 is attached to one of cylinders 720 that are open on both ends to permit airflow through the computing devices.

Figure 8:
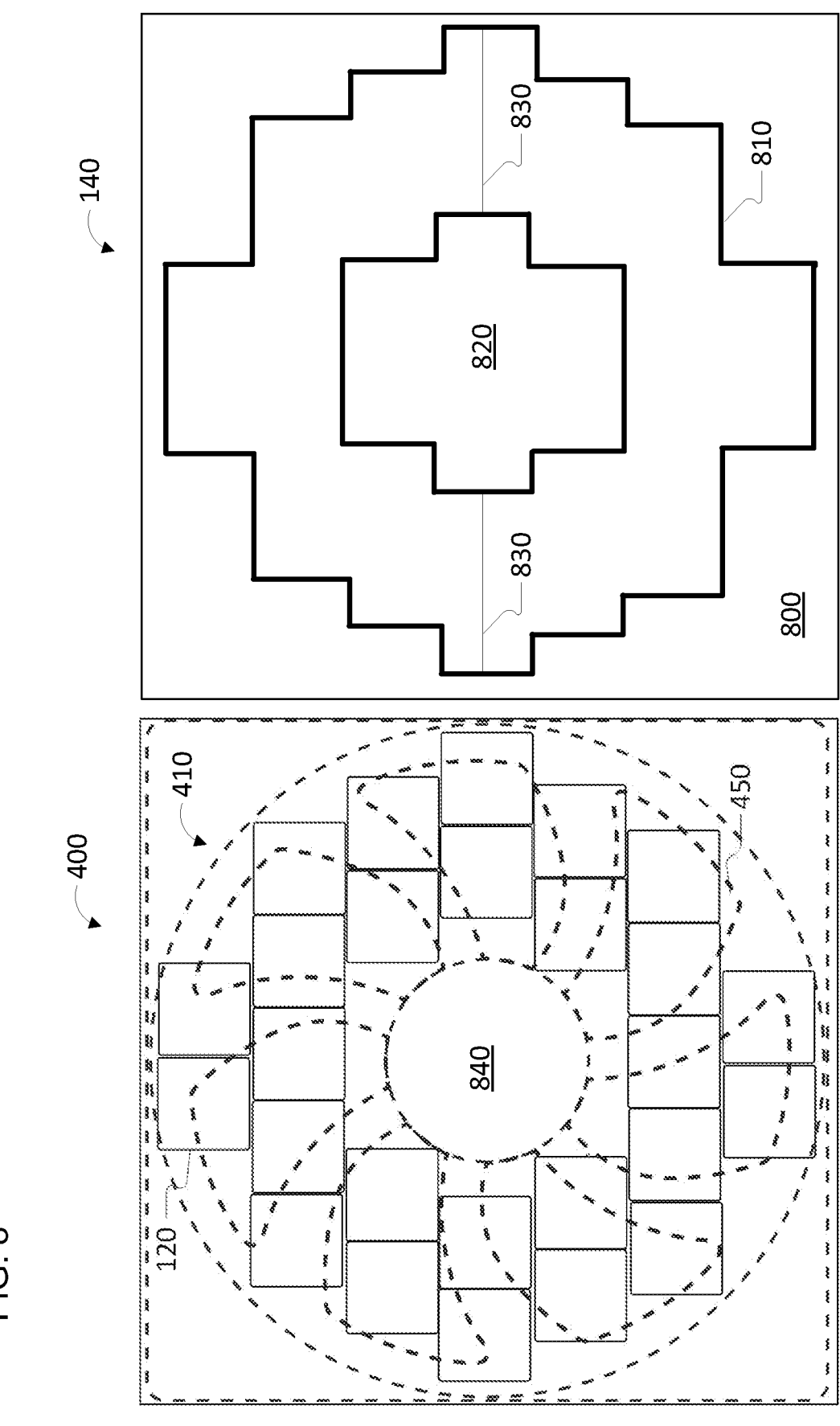
FIG. 8 is a diagram generally illustrating another example embodiment of a system for cooling computing devices and an example embodiment of an air barrier according to the teachings of the present disclosure.

Turning now to FIG. 8, a diagram generally illustrating another example embodiment of a system 400 for cooling computing devices and an example embodiment of an air barrier according to the teachings of the present disclosure is shown. In this embodiment, two-dimensional array of computing devices 410 is configured with a central region 840 that is devoid of any computing devices 120. In some embodiments, this central region 840 may correspond to the hub of impeller 450, where air flow is likely to be lower (as compared with the airflow adjacent to the blades of impeller 450).

Also shown is an example embodiment of an air barrier 140 (which may be positioned behind the array of computing devices 410) to prevent hot air from leaking back around and being drawn into computing devices 120. In this embodiment, the air barrier 140 has a first portion 800 with an opening 810 having an outline corresponding to the outer boundary of the two-dimensional array of computing devices 410 and a second portion 820 with a boundary corresponding to the central region 840 without computing devices. The second portion 820 may be held in place by optional supports 830. While different materials may be used for air barrier 140, foil-backed foam, plywood, sheet metal, or combinations thereof may be used in some embodiments.

Figure 9:
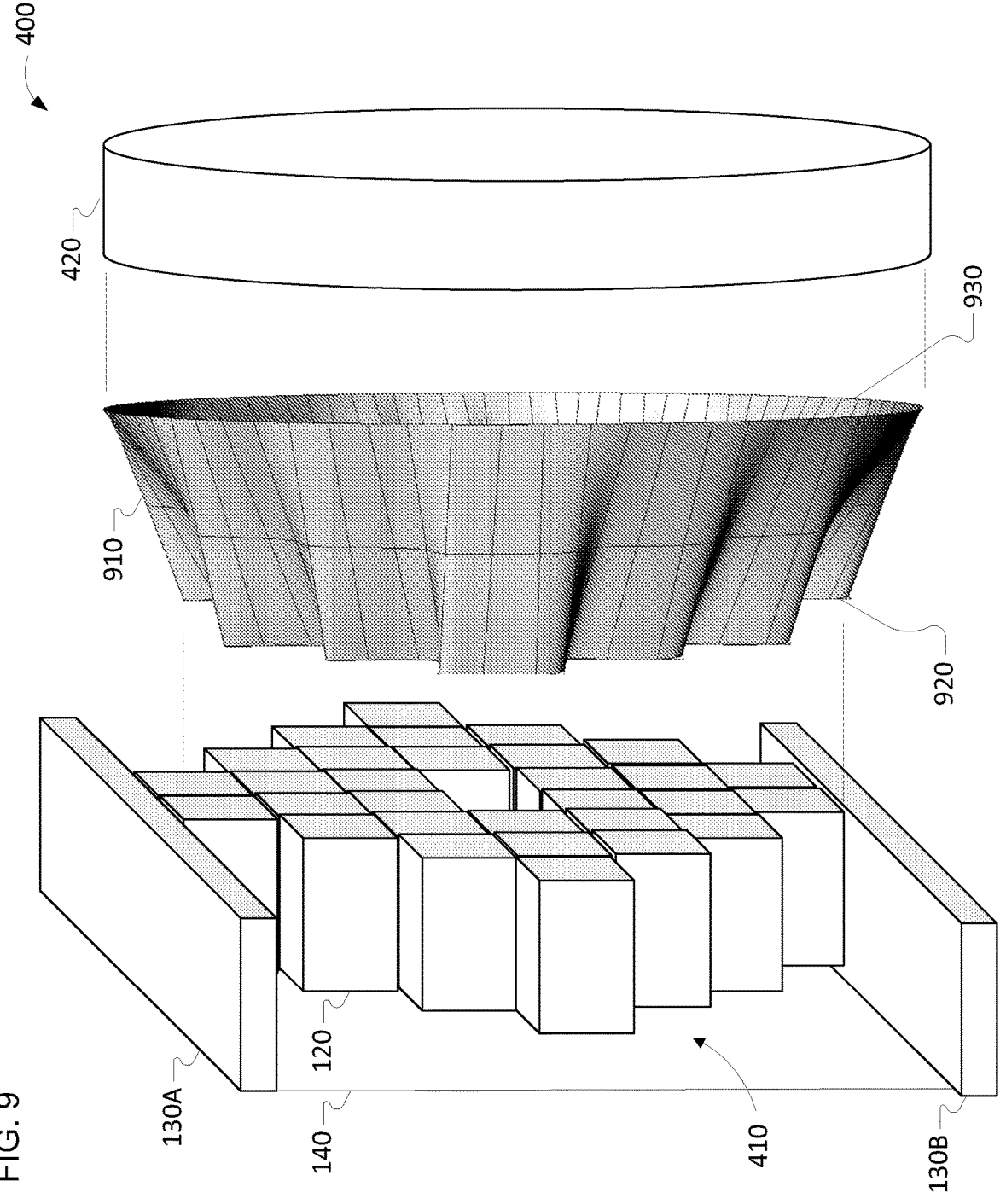
FIG. 9 is a diagram generally illustrating an exploded perspective view of another example embodiment of a system for cooling computing devices including a shroud according to the teachings of the present disclosure.

Turning now to FIG. 9, a diagram generally illustrating an exploded perspective view of another example embodiment of a system 400 for cooling computing devices including a shroud 910 according to the teachings of the present disclosure is shown. In this embodiment, a shroud 910 is positioned between the array of computing devices 410 and the fan 420 to improve airflow and reduce or eliminate air leakage from between the fan 420 and array of computing devices 410 by better sealing them together. In this embodiment, the shroud may have a first end 930 having a circular profile corresponding to the output of the fan and a second end 920 having a profile corresponding to the extents of the two-dimensional array of computing devices. Shroud 910 may be made of sheet metal, wood, or plastic and may be attached (e.g., sealed) to fan 420 and array of computing devices 410 by bolts, clips, or even adhesives or magnets.

Figure 10:
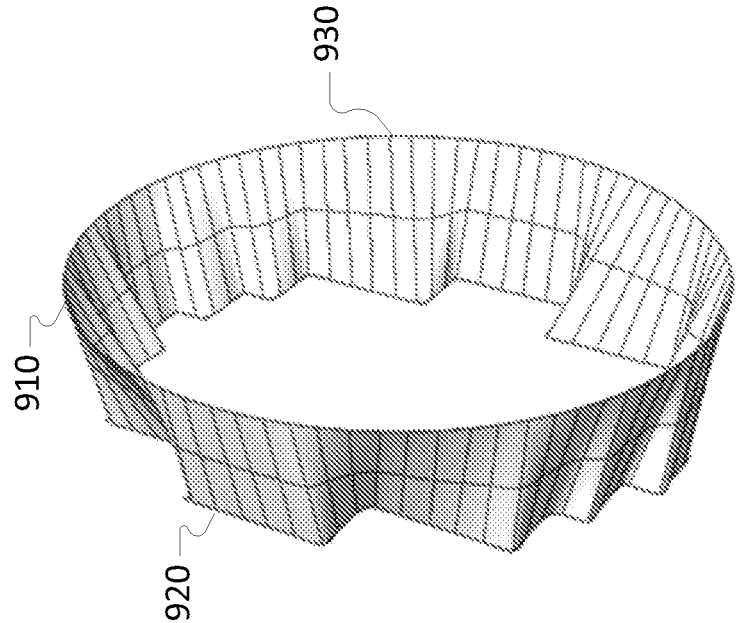
FIG. 10 is a diagram generally illustrating an example embodiment of a shroud for cooling computing devices according to the teachings of the present disclosure.

Turning now to FIG. 10, another view of shroud 910 is shown. illustrating an example embodiment of a shroud for cooling computing devices according to the teachings of the present disclosure is shown. The exact shape and cross-section of shroud 910 may vary based on the configuration of the array of computing devices and the size of the fan being used. In some embodiments, shroud 910 may be constructed of panels sheet metal (e.g., riveted or glued together), 3D-printed plastic.

Figure 11:
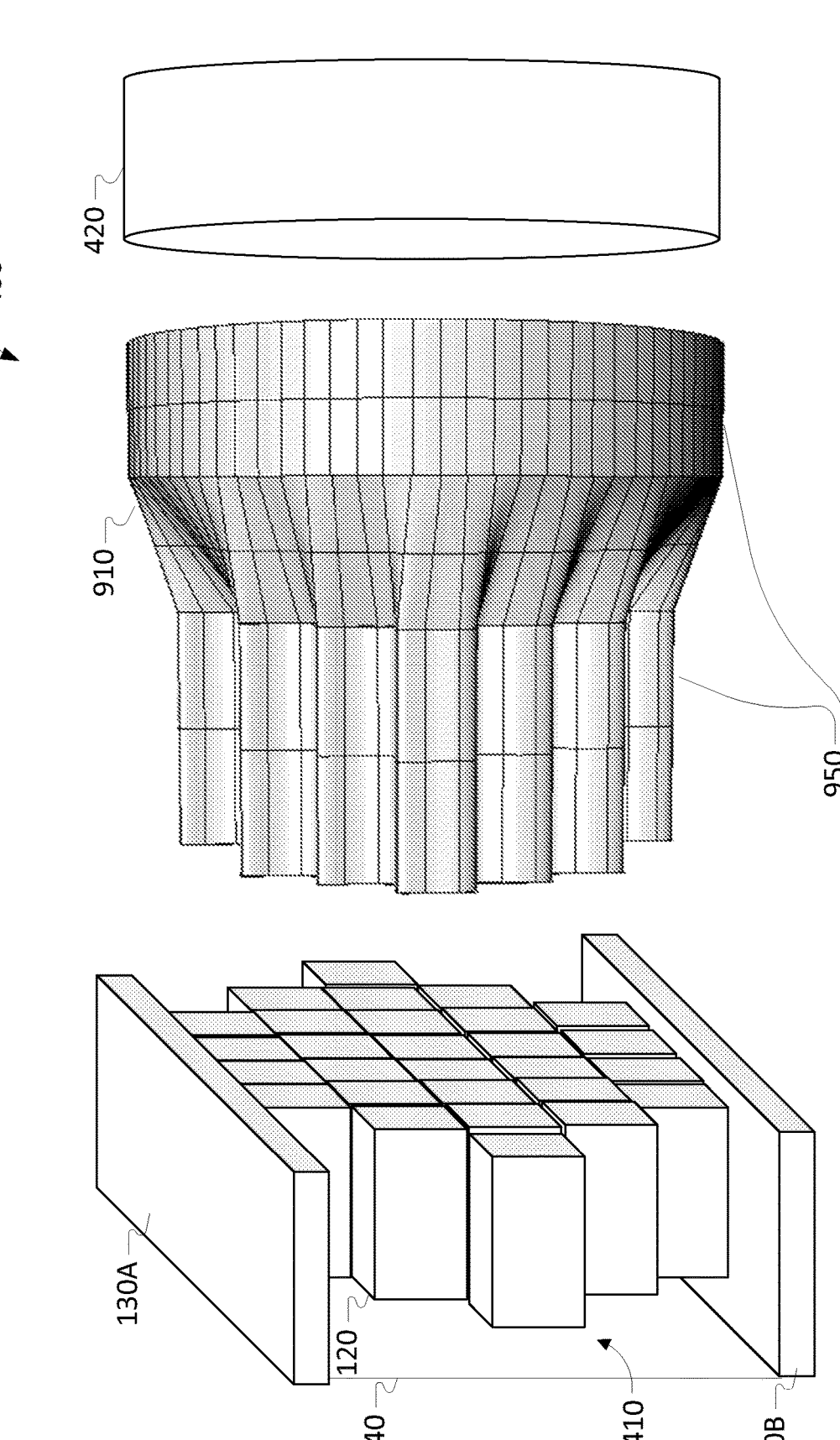
FIG. 11 is a diagram generally illustrating yet another example embodiment of a system for cooling computing devices including a shroud according to the teachings of the present disclosure.

Turning now to FIG. 11, a diagram generally illustrating an exploded view of yet another example embodiment of a system 400 for cooling computing devices 120 is shown. In this embodiment, shroud 910 features elongated portions 950 that move fan 420 farther from the array of computing devices 410. This may have the benefit of evening out the airflow from fan 420 and preventing computing devices 120 in the center of array of computing devices 410 from receiving less air flow due to being in close proximity to the hub of fan 420.

Figure 12:
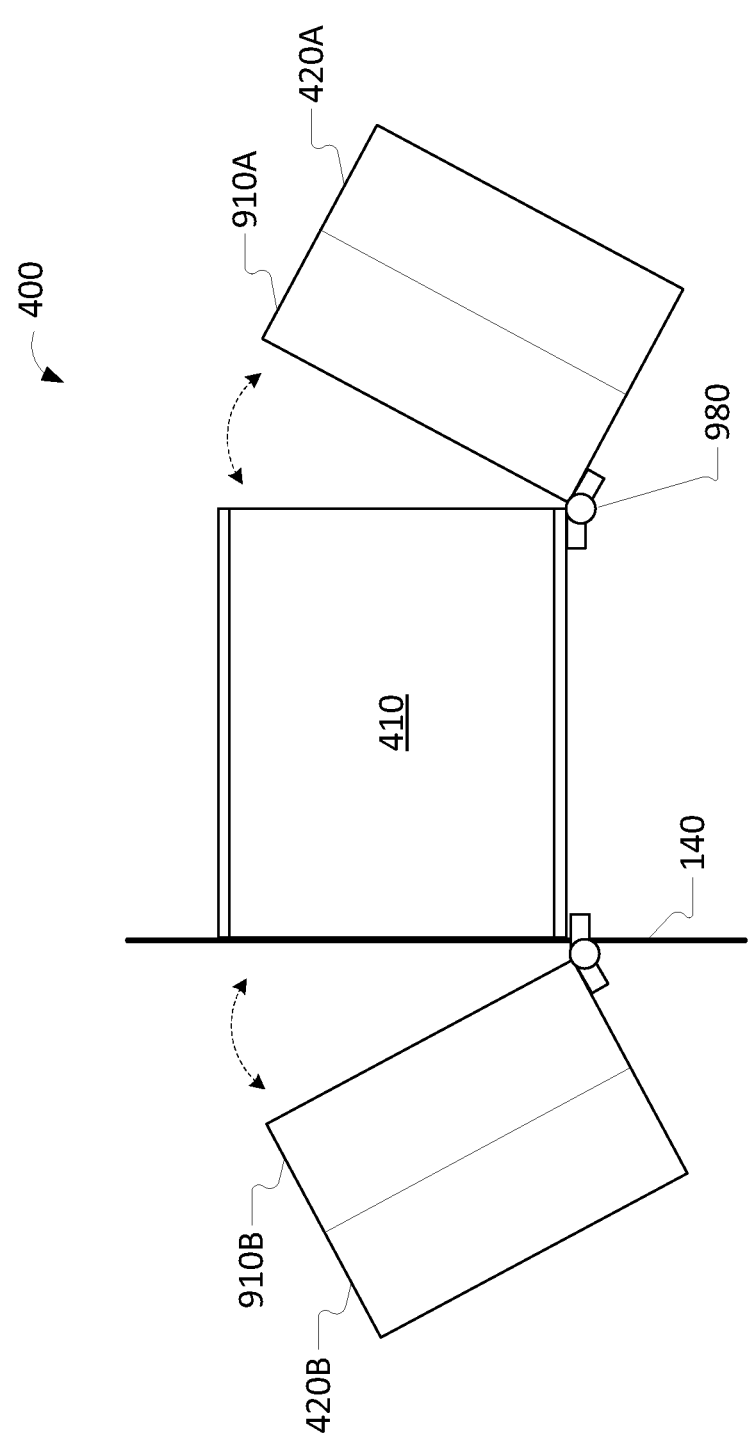
FIG. 12 is a diagram generally illustrating a top-down view of one example embodiment of a system for cooling computing devices according to the teachings of the present disclosure.

Turning now to FIG. 12, a diagram generally illustrating a top-down view of one example embodiment of a system 400 for cooling computing devices according to the teachings of the present disclosure is shown. In this embodiment, the shroud 910A and fan 420A are mounted to array of computing devices 410 with a hinge 980 that permits shroud 910A and fan 420A to be rotated away from array of computing devices 410 (e.g., for maintenance purposes).

In some embodiments, a second shroud 910B and fan 420B may be used to further increase the airflow through the array of computing devices 410. Fans 420A and 420B may be positioned on opposite ends of the array of computing devices 410 and configured to force air through the array of computing devices 410, e.g., in a push-pull configuration with one pushing and the other pulling the air.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

The invention claimed is:

1. A system for cooling a plurality of computing devices, the system comprising:
   a shelf configured to support the plurality of computing devices in a two-dimensional array;
   a first fan configured to move air through the plurality of computing devices, wherein the first fan's width and height corresponds to the two-dimensional array's width and height; and
   wherein the plurality of computing devices do not have individual fans, and wherein the two-dimensional array is circular with a diameter approximately matching the first fan's width.

2. The system of claim 1, further comprising a first shroud connected between the first fan and the plurality of computing devices.

3. The system of claim 2, wherein the first shroud has a first end having a circular profile corresponding to the first fan and a second end having a profile corresponding to the outer edge of the two-dimensional array of computing devices.

4. The system of claim 1, wherein the first fan is a bladeless loop fan.

5. The system of claim 1, wherein the two-dimensional array of computing devices has a hollow a central region devoid of computing devices.

6. The system of claim 5, wherein the central region corresponds to a hub of the first fan.

7. The system of claim 6, wherein one or more components of the plurality of computing devices that do not require greater cooling are positioned within the central region.

8. The system of claim 1, wherein the two-dimensional array is a radial two-dimensional array.

9. The system of claim 7, further comprising an air barrier affixed to the two-dimensional array of computing devices, wherein the air barrier has an opening corresponding to an outline of the two-dimensional array of computing devices.

10. The system of claim 9, wherein the air barrier has a central portion with a boundary corresponding to the central region.

11. The system of claim 3, wherein the first shroud prevents a drop in air pressure between the first fan and the computing devices.

12. The system of claim 3, wherein the first shroud and first fan are connected to the two-dimensional array of computing devices with a hinge permitting the first shroud and the first fan to be rotated away from the two-dimensional array of computing devices.

13. The system of claim 1, wherein the first fan is configured to push air through the two-dimensional array of computing devices.

14. The system of claim 1, wherein the first fan is configured to pull air through the two-dimensional array of computing devices.

15. The system of claim 1, further comprising a second fan configured to move air through the plurality of computing devices, wherein the second fan's width and height corresponds to the two-dimensional array's width and height, wherein the first and second fans are positioned on opposite ends of the two-dimensional array of computing devices in a push-pull configuration.

16. The system of claim 11, further comprising a second fan connected to a second shroud which is connected to the two-dimensional array of computing devices, wherein the second fan is configured to move air through the second shroud and the plurality of computing devices, wherein the second fan's width and height corresponds to the two-dimensional array's width and height, wherein the first and second fans are positioned on opposite ends of the two-dimensional array of computing devices in a push-pull configuration.

17. The system of claim 1, further comprising a management computer executing a management program configured to receive ambient temperature data and temperature data from the computing devices and set a speed of the first fan based thereon.

18. A shroud for cooling a plurality of computing devices, the shroud comprising:
   a first planar circular opening that seals to a cooling fan; and
   a second planar convex polygon opening that seals to an outer edge of a two-dimensional array of fan-less computing devices.

19. A system for cooling a plurality of computing devices, the system comprising:
   a rack supporting a plurality of two-dimensional arrays of computing devices; and
   a plurality of fans, wherein each fan is attached to the rack and is connected to move air through a selected one of the two-dimensional arrays of computing devices, wherein each fan's diameter corresponds to the width and height of the selected two-dimensional array of computing devices.

* * * * *